United States Patent
Jang et al.

(10) Patent No.: US 11,201,591 B2
(45) Date of Patent: Dec. 14, 2021

(54) ASYMMETRIC DOHERTY AMPLIFIER CIRCUIT WITH SHUNT REACTANCES

(71) Applicant: Cree, Inc., Durham, NC (US)

(72) Inventors: Haedong Jang, San Jose, CA (US); Sonoko Aristud, San Jose, CA (US); Marvin Marbell, Morgan Hill, CA (US); Madhu Chidurala, Los Altos, CA (US)

(73) Assignee: Cree, Inc., Durham, NC (US)

( * ) Notice: Subject to any disclaimer, the term of this patent is extended or adjusted under 35 U.S.C. 154(b) by 76 days.

(21) Appl. No.: 16/358,985

(22) Filed: Mar. 20, 2019

(65) Prior Publication Data

US 2020/0304074 A1 Sep. 24, 2020

(51) Int. Cl.
*H03F 3/68* (2006.01)
*H03F 1/02* (2006.01)
(Continued)

(52) U.S. Cl.
CPC ............ *H03F 1/0288* (2013.01); *H03F 1/56* (2013.01); *H03F 3/19* (2013.01); *H03F 3/211* (2013.01);
(Continued)

(58) Field of Classification Search
CPC . H03F 1/0288; H03F 3/19; H03F 1/56; H03F 2200/222; H03F 2200/447;
(Continued)

(56) References Cited

U.S. PATENT DOCUMENTS

| 7,078,976 B2 * | 7/2006 | Blednov | ................. H01L 24/49 |
| | | | 330/124 R |
| 7,800,448 B2 * | 9/2010 | Blednov | ............... H03F 1/0288 |
| | | | 330/295 |

(Continued)

OTHER PUBLICATIONS

Wu, D. Y., et al., A Modified Doherty Configuration for Broadband Amplification Using Symmetrical Devices, IEEE Transactions on Microwave Theory and Techniques, vol. 60, No. 10, Oct. 2012.
(Continued)

*Primary Examiner* — Khanh V Nguyen
(74) *Attorney, Agent, or Firm* — Coats & Bennett, PLLC

(57) ABSTRACT

In an asymmetric Doherty amplifier circuit, one or more shunt reactive components are added to at least one side of an impedance inverter connecting the amplifier outputs, to reduce a capacitance imbalance between the two amplifiers caused by their different parasitic capacitances. This enables the (adjusted) parasitic capacitances to be incorporated into a quarter-wavelength transmission line, having a 90-degree phase shift, for the impedance inverter. In one embodiment, a shunt inductance is connected between the impedance inverter, on the side of the larger amplifier, and RF signal ground. The inductance is sized to resonate away substantially the excess parasitic capacitance of the larger amplifier. In another embodiment, a shunt capacitor is connected on the side of the smaller amplifier, thus raising its total capacitance to substantially equal the parasitic capacitance of the larger amplifier. In other embodiments shunt inductances and/or capacitors may be added to one or both amplifiers, and sized to effectively control a characteristic impedance of the impedance inverter.

28 Claims, 8 Drawing Sheets

(51) Int. Cl.
*H03F 1/56* (2006.01)
*H03F 3/19* (2006.01)
*H03F 3/21* (2006.01)

(52) U.S. Cl.
CPC .. *H03F 2200/222* (2013.01); *H03F 2200/447* (2013.01); *H03F 2200/451* (2013.01)

(58) Field of Classification Search
CPC .... H03F 2200/451; H03F 3/602; H03F 3/607; H03F 3/60; H03F 3/68; H03F 3/211; H03F 3/191; H03F 3/193; H03F 3/604
USPC ..................................... 330/124 R, 286, 295
See application file for complete search history.

(56) References Cited

U.S. PATENT DOCUMENTS

| | | | | |
|---|---|---|---|---|
| 8,228,123 | B2* | 7/2012 | Blednov | H03F 1/0288 330/295 |
| 8,354,882 | B2* | 1/2013 | Blednov | H03F 3/195 330/124 R |
| 9,496,837 | B2* | 11/2016 | Qureshi | H03F 1/0288 |
| 9,876,474 | B2* | 1/2018 | Zhang | H01L 23/66 |
| 2011/0204980 | A1 | 8/2011 | Blednov | |
| 2014/0347133 | A1* | 11/2014 | Qureshi | H03F 1/07 330/295 |
| 2015/0145600 | A1* | 5/2015 | Hur | H03F 1/0222 330/295 |
| 2015/0155838 | A1* | 6/2015 | Embar | H03F 1/56 330/295 |
| 2018/0175802 | A1 | 6/2018 | Wu et al. | |

OTHER PUBLICATIONS

Qureshi, J. H., et al., A Wide-Band 20W LMOS Doherty Power Amplifier, IEEE MTT-S, International Microwave Symposium, Anaheim, CA, May 2010, pp. 1504-1507.

* cited by examiner

ASYMMETRIC DOHERTY AMPLIFIER CIRCUIT WITH SHUNT REACTANCES

FIELD OF INVENTION

The present invention relates generally to Radio Frequency amplifier circuits, an in particular to an asymmetric RF Doherty amplifier configuration with shunt reactive components on one or both sides of an impedance inverter, to implement the impedance inverter and/or control a characteristic impedance of the impedance inverter.

BACKGROUND

Modern wireless communication networks operate by transmitting voice and data content modulated onto Radio Frequency (RF) signals, generally between fixed access points (known as base stations, eNB, gNB, etc.) and a large number of mobile terminals (User Equipment or UE, tablets, laptops, etc.). Signal transmissions in both directions require RF power amplifiers. Efficiency (output power divided by input power) is an important consideration in both cases. Efficient power amplifiers are desired at access points because inefficient amplifiers simply turn much of the power consumed into heat, raising operating costs and requiring physical designs to discharge the heat. The power amplifier in a mobile terminal is a major consumer of battery power, and high efficiency is desired to extend the useful device lifetime per charge.

Amplifiers operate most efficiently at or near compression—the point at which an amplifier is always ON, or strongly conducting. An amplifier operating below its compression point operates in a linear range—the output signal is an amplified version of the input signal. Amplifiers that operate partially or totally in compression can transmit frequency/phase modulated signals, or On-Off Keying modulated signals (e.g., Morse code), at high power with high efficiency. In these applications, linearity is not required—that is, the amplifier may distort the signal amplitude without affecting the information modulated onto the signal. However, communication signals that encode information, even in part, by modulating the amplitude of a carrier signal require power amplifiers to operate with high linearity, to preserve the AM information.

Many of the signal modulation schemes standardized for use in modern wireless communication networks, such as for example, the various levels of Quadrature Amplitude Modulation (16-QAM, 64-QAM, 256-QAM), require a linear amplifier to avoid loss of amplitude-modulated information that would occur if the amplifier ran in compression. A characteristic of many such signals is that the average signal power is relatively low, but intermittent peaks in the signal have high power, compared to the average. This characteristic is quantified as the Peak to Average Power Ratio (PAPR). A single power amplifier transmitting a high-PAPR signal exhibits low efficiency, as it must be sized for signal peaks, which occur infrequently, and on average it runs at very low power. That is, the power amplifier must be designed with a large "headroom" that, on average, is not used. Since the operating point of the amplifier is far below its compression point, efficiency is poor. This means much of the power it consumes (from a battery in the case of a mobile terminal) is wasted as heat.

William Doherty solved this problem in 1936, designing a power amplifier having improved efficiency while transmitting high-PAPR AM radio signals. A Doherty amplifier 6, represented in block diagram form in FIG. 1, comprises a first amplifier 14a used for most signal amplification, often referred to as a "main" or "carrier" amplifier, and a second amplifier 14b used to amplify signal peaks, often referred to as an "auxiliary" or "peak" amplifier. The more general terms "first" and "second" amplifier are used herein. A class AB amplifier is often used for the first amplifier 14a, which can be biased to amplify the average signal within a linear range, but close to compression (i.e., with low headroom). Signal peaks are amplified by, e.g., a class C amplifier as the second amplifier 14b, which is inactive most of the time, and only needs to be linear over a small portion of the input signal conduction angle.

A feature of the Doherty amplifier is the output connection of the first 14a and second 14b amplifiers, which is made through an impedance inverter 22, often implemented using a quarter-wavelength transmission line, and having a 90-degree phase shift. At low input signal power levels, the second amplifier 14b is inactive, and the impedance inverter 22 presents a high output impedance to the first amplifier 14a, improving its efficiency. As the second amplifier 14b begins to amplify signal peaks, its output current increases the voltage across the load impedance, which the impedance inverter 22 presents to the first amplifier 14a as a decreasing impedance, allowing its output power to increase as the input signal power increases. This is known as load-modulation, and it results in the Doherty amplifier 6 exhibiting high efficiency across the full range of input signal power.

Referring to FIG. 1, a power divider circuit 8 divides an RF input signal between the first 14a and second 14b amplifiers in response to its instantaneous power level. A phase shifter 10 delays the phase of the second amplifier 14b input by 90 degrees, to match the 90-degree delay which the output impedance inverter 22 applies to the output of the first amplifier 14a. In some embodiments, the power divider 8 and phase shifter 10 may be combined in a quadrature power divider, which both splits the input signal and applies a 90-degree phase shift to the second amplifier 14b input. Input matching circuits 12a, 12b perform impedance matching, e.g., matching a standard 50Ω system impedance to the low input impedances of the first 14a and second 14b amplifiers.

Real-world RF power amplifiers 14a, 14b, such as Laterally Diffused Metal Oxide Semi-conductor (LDMOS) or Gallium Nitride (GaN) HEMT devices, have non-negligible parasitic components. These parasitic effects are modeled in FIG. 1, and in schematic diagrams throughout this disclosure, as lumped capacitances 16a, 16b and lumped inductances 18a, 18b. As used herein, a "lumped" component represents spatially distributed electrical and physical circuit effects as one (or two, when associated with separate amplifiers 14a, 14b) electrical components, such as a resistor, capacitor, inductor, or the like. Such lumping of circuit effects greatly simplifies simulation, and is reasonably accurate over at least some range of operating conditions (power, frequency, etc.). For example, the lumped inductances 18a, 18b represent primarily the series inductances of bond wires connecting the device die to a package, but also include parasitic inductances arising from a number of other sources, such as metal interconnect, component pins, and the like. Similarly, the lumped capacitances 16a, 16b represent primarily the source to drain capacitance $C_{DS}$ of the transistor devices 14a, 14b, but also the distributed capacitance of clock distribution lines and other conductors, charge accumulation between layers of an integrated circuit, and the like. As yet another example, in FIG. 2 the real part of various resistive, inductive, and capacitive loads seen by Doherty amplifier are modeled as a single resistor $R_{sum}$.

Returning to FIG. 1, one consequence of the parasitic capacitances 16a, 16b of the first 14a and second 14b amplifier devices is to limit the Doherty amplifier bandwidth. To tune out these parasitic capacitances, parasitic compensating circuits 20a, 20b, which may each include a parallel resonator, are often added to the amplifier 14a, 14b outputs. Bandwidth is also improved by matching the first 14a and second 14b amplifier output impedances to the load impedance $Z_{load}$. Accordingly, the parasitic compensating circuit 20 may in some cases also include an impedance matching circuit. These impedance matching circuits often each include 90-degrees of phase shift.

As described above, the outputs of the first 14a and second 14b amplifiers in a Doherty configuration are connected by an impedance inverter 22 having a 90-degree phase delay. The impedance inverter 22 is often implemented using a quarter-wavelength transmission line. The output of the Doherty amplifier 6 is taken at a so-called summing node, typically on the second amplifier 14b side of the impedance inverter 22. An output impedance matching circuit (OMN) 24, such as an impedance transformer, matches the load impedance $Z_{load}$ to the standard 50Ω system impedance. Because the impedance inverter 22 adds 90 degrees of phase shift, in Doherty amplifiers 6 of the prior art such as that modeled in FIG. 1, where parasitic compensation and output matching circuits 20a, 20b each add 90 degrees of phase shift, there is a total electrical length of 270 degrees in the output path. This increases the physical size of the Doherty amplifier 6, making dense integration more challenging.

FIG. 2 is a simplified circuit model of a Doherty amplifier 6, in which the first 14a and second 14b amplifiers are modeled as ideal current sources. The impedance inverter 22 is a quarter-wave transmission line, with a 90-degree phase shift. The combined output power is taken from the summing node, and the load is represented by a resistor $R_{sum}$. Input and output impedance matching circuits, and parasitic compensation circuits, are omitted for clarity.

One important development in modern wireless communication networks is the use of spatial diversity and/or spatial multiplexing. Spatial diversity refers to transmitting the same signal on different propagations paths (e.g., different transmit/receive antennas), which increases robustness against fading, co-channel interference, and other deleterious effects of RF signal transmission. Spatial multiplexing also uses multiple transmit and receive antennas, and refers to transmitting different portions of data on different propagation paths, using space-time coding, to increase data rates. These techniques are collectively referred to as Multiple Input, Multiple Output, or "MIMO." The key to all MIMO techniques is the deployment of multiple antennas, on at least one and preferably both sides of the air interface channel. Fourth generation (4G) network standards contemplate 2, 4, or 8 antennas per transceiver; however, fifth generation (5G) networks currently being defined envision up to 128 antennas per transceiver. Each antenna used to transmit an RF signal requires a power amplifier. Hence, compact design and the integration of as many components as possible into the same integrated circuit packages become important design considerations for RF power amplifiers.

5G communications standards additionally span far greater frequency ranges than do 4G, and spread signals over far greater bandwidths. Accordingly, broadband operation of the power amplifiers is desirable. Conventional Doherty amplifiers 6 have relatively narrow bandwidths, limited by the impedance inverter, but also by the parasitic capacitances 16a, 16b of the amplifier devices 14a, 14b. One known approach to improving the bandwidth, as well as facilitating a more compact design, is a type of impedance inverter 26 that compensates the amplifiers' parasitic capacitances 16a, 16b by absorbing them into a transmission line forming the impedance inverter 26. This eliminates the need for a parallel resonator in parasitic compensation circuits 20a, 20b at the amplifier output to tune out the parasitic capacitances 16a, 16b, both improving operating bandwidth and facilitating a more compact, integrated design. FIG. 3A depicts a schematic of a lumped inductance version of such an impedance inverter 26. The lumped inductance L is realized by the bond wires, and the capacitors $C_{DS}$ are the parasitic capacitances 16a, 16b of the amplifiers 14a, 14b. The characteristic impedance $Z_0$ of the impedance inverter 26 is given by:

$$Z_0 = \omega L = \frac{1}{\omega C_{DS}} \tag{1}$$

where ω is the angular frequency of the signal to be amplified.

FIG. 3B is a schematic showing this type of impedance inverter 26 implemented as a transmission line, along with lumped inductances 18a, 18b from bond wires and the parasitic capacitances 16a, 16b of the amplifier devices 14a, 14b, resulting in a quasi-lumped transmission line. See J. H. Qureshi, et al., "A Wide-Band 20W LMOS Doherty Power Amplifier," 2010 IEEE MTT-S International Microwave Symposium, p. 1504, the disclosure of which is incorporated herein in its entirety.

FIG. 4 is a block diagram of a symmetric Doherty amplifier 28 incorporating this type of impedance inverter 26. The impedance inverter 26 performs the same function as the impedance inverter 22 of the amplifier 10 of FIG. 1. However, the impedance inverter 26 comprises a quarter-wave transmission line comprising the lumped inductances 18a, 18b of the bond wires, and the parasitic capacitances 16a, 16b of the first 14a and second 14b amplifiers. Accordingly, these parasitic effects are no longer depicted as associated with the amplifiers 14a, 14b. Also, since the parasitic capacitances 16a, 16b are now incorporated into the impedance inverter 26, the parasitic compensation circuits 20a, 20b are no longer required.

The Doherty amplifier 6, 28 can exhibit broadband behavior at a given power level if the load seen by the impedance inverter 22, 26 ($Z_{load}$ in FIGS. 1 and 4) is equal to its characteristic impedance. Wu and Boumaiza presented a parametric approach to determining the parameters $Z_T'$ and θ' of the impedance inverter 26 model of FIG. 3B, by determining the overall ABCD-parameters of the circuit and solving it against the ABCD-parameters of an ideal quarter-wave transmission line at a center frequency $f_c$. See David Yu-Ting Wu, et al., "A Modified Doherty Configuration for Broadband Amplification Using Symmetrical Devices," IEEE Transactions on Microwave Theory and Techniques, Vol. 60, No. 10, October 2012, the disclosure of which is incorporated herein in its entirety.

As the later paper's title suggests, the approach of the impedance inverter 26—incorporating parasitic inductances and capacitances to form a transmission line—is limited to symmetric Doherty amplifier configurations—that is, where the first 14a and second 14b amplifiers are the same size (and hence present the same parasitic capacitances 16a, 16b). While symmetric Doherty amplifiers are simpler to design, and achieve efficiency improvement over single amplifier designs, they do not offer the best performance. A more common configuration is an asymmetric Doherty amplifier, in which the second amplifier 14b, which amplifies signal peaks, is larger than the first amplifier 14a. Due to this difference in the device sizes, the two amplifiers 14a, 14b have different parasitic capacitances 16a, 16b associated with them. The impedance inverter 26 technique described in the above-cited papers does not work with asymmetric Doherty amplifiers, as the unequal parasitic capacitances 16a, 16b of the two amplifiers 14a, 14b yield an impedance inverter that does not achieve 90 degrees of phase shift. However, asymmetric Doherty amplifiers are generally preferred for their greater output power and efficiency with high-PAPR signals.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, an improved impedance inverter for an asymmetric Doherty amplifier includes one or more shunt reactive components added to at least one side, to reduce an imbalance of capacitances between the amplifiers (e.g., caused by different parasitic capacitances) used in the asymmetric Doherty amplifier. Reducing the differences between these capacitances enables them to be incorporated into an impedance inverter.

As used herein, a "shunt reactive component" refers to a reactive component—comprising at least a capacitor or inductance—connected in a shunt topology, between one side of an impedance inverter and RF signal ground. For example, a shunt reactive component may comprise a capacitor connected between one side of an impedance inverter and ground. As another example, a shunt reactive component may comprise an inductance, e.g., in the form of one or more bond wires, connected between one side of an impedance inverter and RF signal ground. The RF signal ground connection may be made through a DC blocking capacitor sized to present substantially a short circuit at the RF signal frequency. Further, a shunt reactive component may comprise any combination of capacitors and inductances connected between the impedance inverter and RF signal ground.

In one embodiment, a shunt inductance, e.g., implemented as one or more bonding wires, is connected between the impedance inverter and RF signal ground, on the side of the larger amplifier. The shunt inductance is connected to RF signal ground through a DC blocking capacitor, which is large enough to present substantially a short circuit at RF signal frequencies. The inductance is sized to resonate away substantially the excess parasitic capacitance of the larger amplifier, over that of the smaller amplifier, yielding the substantially equal capacitances which, when incorporated into a transmission line of the compact impedance inverter, accomplish a 90-degree phase shift.

In another embodiment, the reduction of capacitance mismatch is achieved by adding a shunt capacitor on the side of the smaller amplifier, thus raising its total capacitance to substantially equal the parasitic capacitance of the larger amplifier. In other embodiments, both an inductance on the large amplifier side and a capacitor on the smaller amplifier side may be added. In any of these cases, the two amplifiers of the Doherty amplifier have substantially equal effective capacitances, and can implement a compact impedance inverter as a quarter-wave transmission line, with a 90-degree phase shift, using a lumped inductance and the parasitic/adjusted capacitances.

In other embodiments, shunt inductances and/or capacitors may be added to one or both sides of the Doherty amplifier, and sized to effectively control a characteristic impedance of the impedance inverter. As discussed above, matching the characteristic impedance of the impedance inverter to the load impedance $Z_{load}$ seen at the summing node can improve bandwidth. Adding one or more shunt inductances and/or capacitors between either or both sides of the impedance inverter and RF signal ground allows the characteristic impedance of the impedance inverter to be adjusted, eliminating the need for an impedance matching circuit as part of a parasitic capacitance compensation circuit.

Note that, although the Doherty amplifiers depicted herein comprise only two amplifier components 14a, 14b for simplicity and ease of explanation, embodiments of the present invention are not limited to this configuration. It is well known in the art to employ multiple stages of amplifier components, configured in series, for one or both of the first 14a and second 14b amplifiers—for example, to achieve greater overall gain. Furthermore, it is known to employ multiple branches of amplifiers (or branches of multiple amplifier stages), configured in parallel—for example, to obtain higher average efficiency with wider back-off operation for the higher PAPR signals. Embodiments of the present invention are advantageously employed in all such variations of asymmetric Doherty amplifier designs. By adding one or more shunt reactive components to one or both sides of the impedance inverter, an imbalance in parasitic capacitance may be reduced, allowing for the incorporation of such capacitances into a compact impedance inverter that achieves a 90-degree phase shift. These designs thus enjoy the benefits of reduced component count, compact IC layout, and improved bandwidth. Shunt reactive components may also be added to multi-stage and/or multi-branch Doherty amplifier designs to adjust the characteristic impedance of the impedance inverter, e.g., allowing for greater bandwidth of operation by matching the characteristic impedance to the load inductance.

One embodiment relates to an amplifier. The amplifier includes a first amplifier of a first size and having a first parasitic capacitance. The amplifier also includes a second amplifier of a second size different than the first size, and having a second parasitic capacitance different than the first parasitic capacitance. The amplifier additionally includes an impedance inverter circuit connecting outputs of the first and second amplifiers. The amplifier further includes one or more shunt reactive components connected between the impedance inverter circuit and RF signal ground, on at least one side of the impedance inverter circuit.

Another embodiment relates to a method of manufacturing an amplifier on an integrated circuit. A first amplifier, of a first size and having a first parasitic capacitance, is provided. A second amplifier, of a second size different than the first size and having a second parasitic capacitance different than the first parasitic capacitance, is provided. An impedance inverter circuit is connected between outputs of the first and second amplifiers. One or more shunt reactive components are connected between the impedance inverter circuit and RF signal ground, on at least one side of the impedance inverter circuit.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 4:
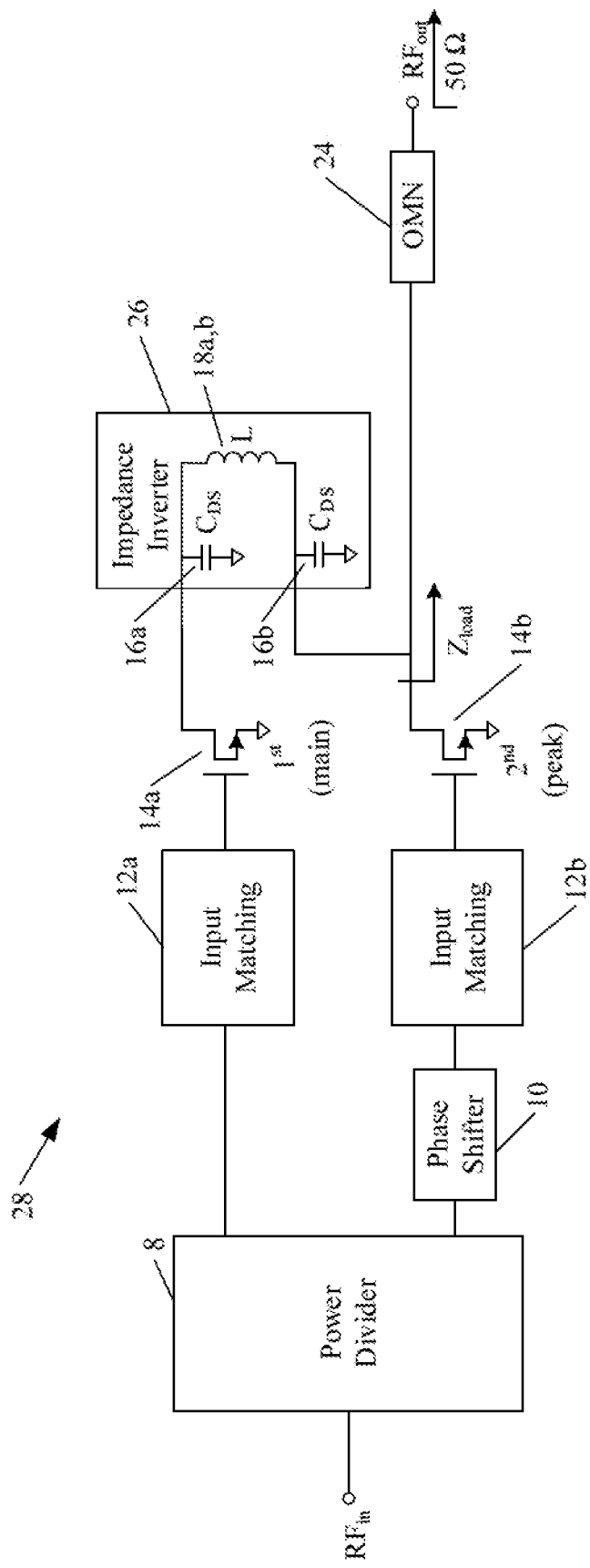
FIG. 4 is a block diagram of a prior art Doherty amplifier incorporating the impedance inverter of FIG. 3A or 3B.
Figure 5A:
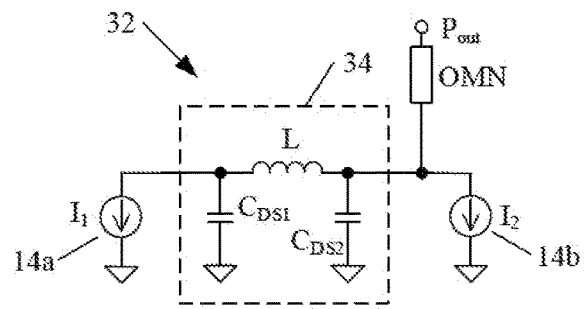
FIG. 5A is a schematic diagram of a Doherty amplifier with an output impedance matching network and a non-quarter-wave, lumped inductance impedance inverter.
Figure 5B:
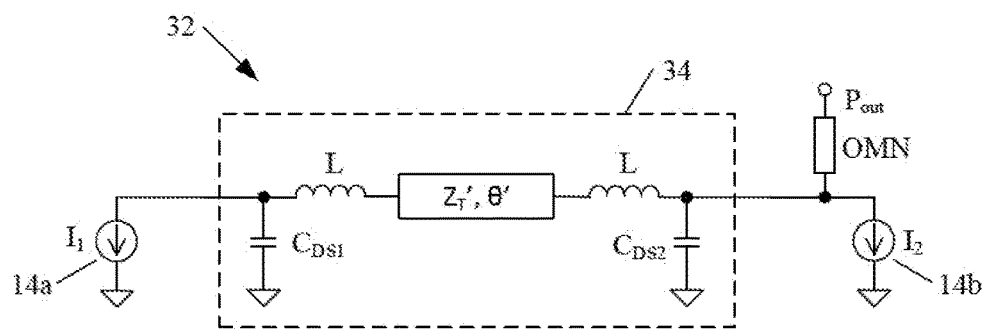
FIG. 5B is a schematic diagram of a Doherty amplifier with an output impedance matching network and a non-quarter-wave, quasi-lumped transmission line impedance inverter.

FIG. 5A depicts an asymmetric amplifier 32, with different-sized amplifiers 14a, 14b modeled as ideal current sources generating currents $I_1$ and $I_2$. In this amplifier circuit 32, the second amplifier 14b has a larger device size than the first amplifier 14a. Consequently, the parasitic capacitances, which depend on device size, are modeled as unequal shunt capacitors $C_{DS1}$ and $C_{DS2}$, where $C_{DS2} > C_{DS1}$. A compact impedance inverter 34, comprising a lumped transmission line, is formed from the inductance L of wire bonds and the parasitic capacitances $C_{DS1}$ and $C_{DS2}$ (note the reference numbers 16a,b; 18a,b; and 24 are omitted for clarity). The power summing node, in this case on the larger amplifier side of the impedance inverter 34, is connected to a system impedance of 50 Ohms through the output impedance matching network (OMN). FIG. 4B depicts the same amplifier 32, using a quasi-lumped transmission line in the impedance inverter 34. In both amplifier 32 circuits, because the parasitic capacitances $C_{DS1}$ and $C_{DS2}$ are unequal, the impedance inverter 34 has a non-90-degree phase shift, and hence will not exhibit the efficiency of a Doherty amplifier.

Figure 6A:
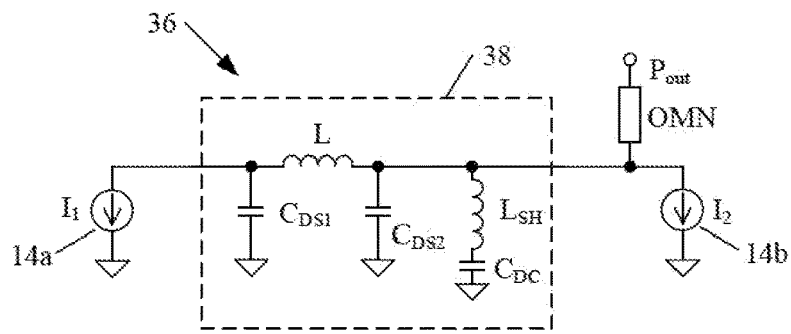
FIG. 6A is a schematic diagram of a Doherty amplifier with a shunt inductance on the side of the second amplifier and a lumped inductance impedance inverter.

FIG. 6A depicts an asymmetric Doherty amplifier 36 according to one embodiment of the present invention. The asymmetric Doherty amplifier 36 has a first amplifier 14a of a first size and having a first parasitic capacitance $C_{DS1}$. The asymmetric Doherty amplifier 36 also has second amplifier 14b of a second size different than the first size, and having a second parasitic capacitance $C_{DS2}$ different than (in this case, larger than) the first parasitic capacitance $C_{DS1}$. An impedance inverter circuit 38 connects the outputs of the first 14a and second 14b amplifiers. The impedance inverter circuit 38 comprises a quarter-wave transmission line comprising a lumped inductance L, both parasitic capacitances $C_{DS1}$, $C_{DS2}$, and a shunt reactive component that reduces the difference between the parasitic capacitances $C_{DS1}$ and $C_{DS2}$. In this case, the shunt reactive component comprises a shunt inductance $L_{SH}$ connected between one side of the impedance inverter 38 and RF signal ground, on the second amplifier 14a side of the Doherty amplifier 36. The shunt inductance $L_{SH}$ is connected to a DC blocking capacitor $C_{DC}$, which is sized to be substantially a short circuit to RF signals.

In one embodiment, the shunt inductance $L_{SH}$ comprises one or more bond wires connecting one side of the impedance inverter 38 to the DC blocking capacitor $C_{DC}$. In one embodiment, the shunt inductance $L_{SH}$ is sized to resonate out the excess parasitic capacitance $C_{DS2}$ over $C_{DS1}$. In this embodiment, the shunt inductance $L_{SH}$ is given by:

$$L_{SH} = \frac{1}{\omega^2(C_{DS2} - C_{DS1})} \qquad (2)$$

Figure 6B:
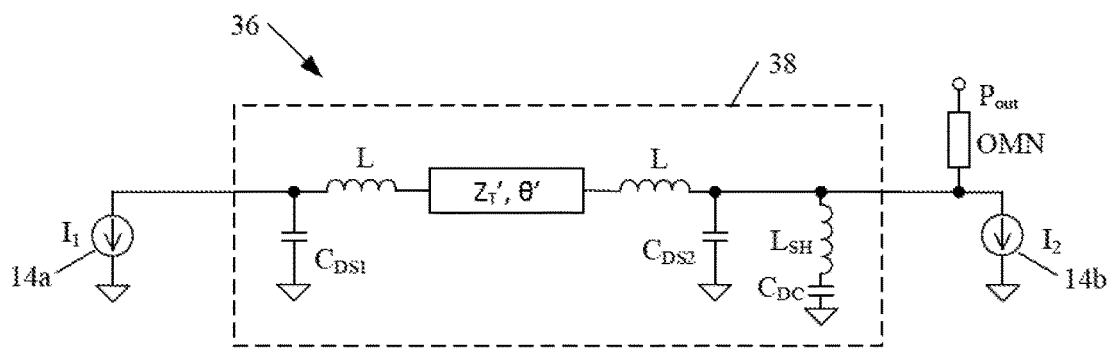
FIG. 6B is a schematic diagram of a Doherty amplifier with a shunt inductance on the side of the second amplifier and a quasi-lumped transmission line impedance inverter.

This circuit presents substantially equal capacitance to each side of the lumped inductance L, to form a transmission line for the impedance inverter 38. Since the capacitances on either side are substantially equal, the transmission line is a quarter-wave, with a 90 degree phase shift. Hence, the efficiency benefits of the Doherty amplifier design are achieved. FIG. 6B depicts an embodiment of the Doherty amplifier 36 with shunt inductance $L_{SH}$ on the second amplifier 14b side, with the impedance inverter 38 comprising a quasi-lumped transmission line.

Figure 7:
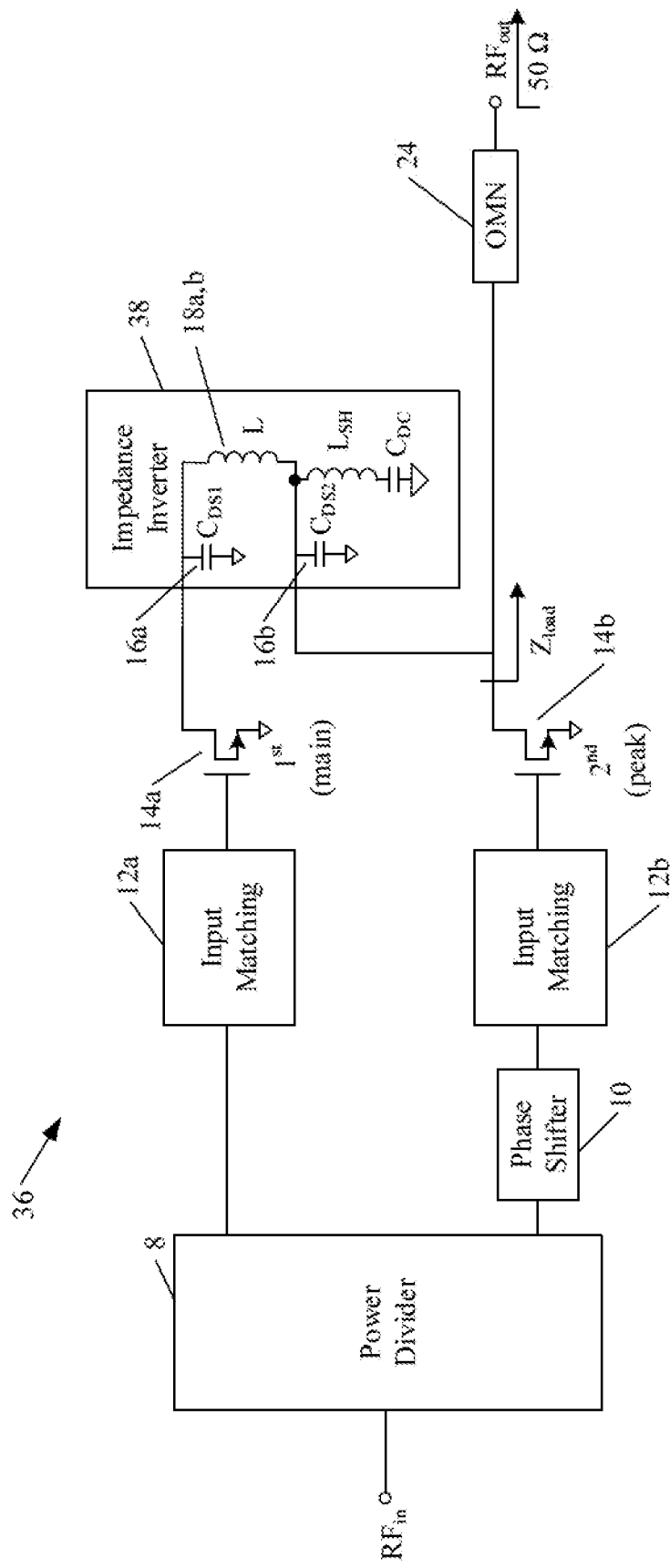
FIG. 7 is a block diagram of an asymmetric Doherty amplifier with a compact impedance inverter incorporating a shunt reactive component.

FIG. 7 depicts the asymmetric Doherty amplifier 36 as a block diagram. The Doherty amplifier 36 includes a compact impedance inverter 38 that incorporates a shunt reactive component $L_{SH}$ to resonate away the excess parasitic capacitance 16b of the second amplifier 14b over that 16a of the first amplifier 14a, thus forming a quarter-wave transmission line having a 90-degree phase shift.

Figure 8A:
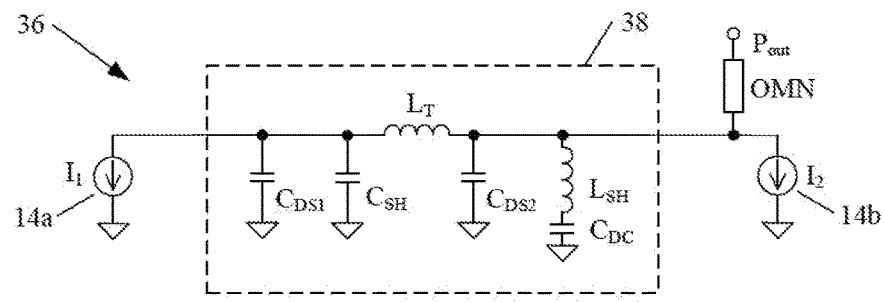
FIG. 8A is a schematic diagram of a Doherty amplifier with a shunt capacitor on the side of the first amplifier and a shunt impedance on the side of the second amplifier, and a lumped inductance impedance inverter.
Figure 8B:
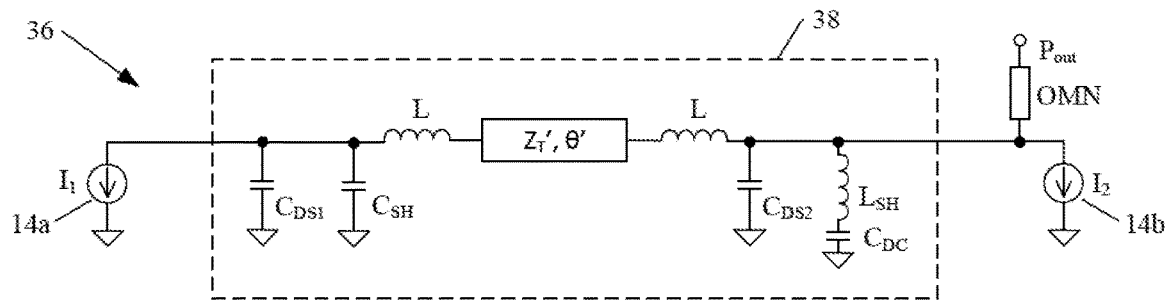
FIG. 8B is a schematic diagram of a Doherty amplifier with a shunt capacitor on the side of the first amplifier and a shunt impedance on the side of the second amplifier, and a quasi-lumped transmission line impedance inverter.

In some cases, the first shunt inductance $L_{SH}$ on the side of the second amplifier 14b may be insufficient to resonate away enough of the second parasitic capacitance $C_{DS2}$ to substantially equal the first parasitic capacitance $C_{DS1}$. In one embodiment, as depicted in FIGS. 8A and 8B, a first shunt capacitor $C_{SH}$ may also be added to the compact impedance inverter 38 on the first amplifier 14a side. The total capacitance on the first amplifier 14a side is then $C_{TOTAL1} = C_{DS1} + C_{SH}$. The first shunt capacitor $C_{SH}$ is sized such that the total capacitance $C_{TOTAL1}$ is substantially equal to the effective capacitance of the second amplifier 14b, which is its parasitic capacitance $C_{DS2}$, reduced by resonance with the first shunt inductance $L_{SH}$. FIG. 6A depicts the asymmetric Doherty amplifier 36 with a lumped inductance in the compact impedance inverter 38; FIG. 6B depicts the amplifier 36 with a quasi-lumped transmission line in the compact impedance inverter 38.

Figure 9A:
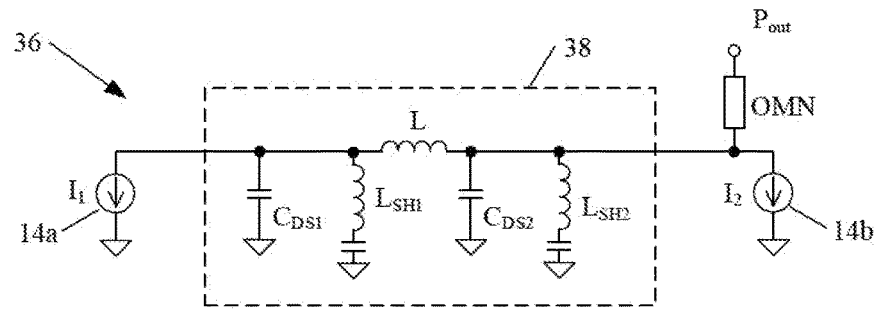
FIG. 9A is a schematic diagram of a Doherty amplifier with shunt impedances on both sides of a lumped inductance impedance inverter.

FIG. 9A depicts an embodiment of an asymmetric Doherty amplifier 36 having a compact impedance inverter 38 with two shunt reactive components—in this case, both shunt inductances $L_{SH1}$ and $L_{SH2}$—connected between opposite sides of the impedance inverter circuit 38 and RF signal ground, on each side of the Doherty amplifier 36. That is, FIG. 9A depicts the asymmetric Doherty amplifier circuit 36 of FIG. 6A, with an additional shunt inductance $L_{SH1}$ added on the first amplifier 14a side. Each of the two shunt inductances $L_{SH1}$ and $L_{SH2}$ may be sized to resonate out as much of the respective parasitic capacitance $C_{DS1}$ or $C_{DS2}$ as desired, and also to control the characteristic impedance of the compact impedance inverter 38. As discussed above, if the characteristic impedance of the compact impedance inverter 38 is matched to the load it sees, the bandwidth of the Doherty amplifier 36 is broadened.

Figure 9B:
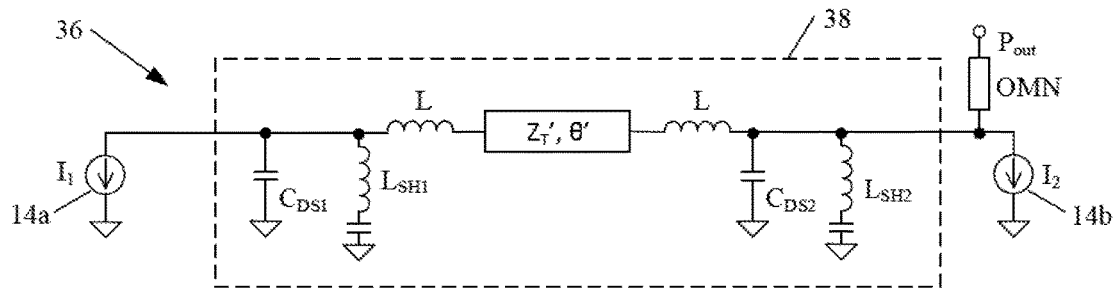
FIG. 9B is a schematic diagram of a Doherty amplifier with shunt impedances on both sides of a quasi-lumped transmission line impedance inverter.

In the circuit of FIG. 9A, the compact impedance inverter 38 comprises a quarter-wave transmission line formed by a lumped impedance L and the parasitic capacitances $C_{DS1}$ and $C_{DS2}$, as modified by the two shunt inductances $L_{SH1}$ and $L_{SH2}$. FIG. 9B depicts a Doherty amplifier circuit 36 with two shunt inductances $L_{SH1}$ and $L_{SH2}$, where the compact impedance inverter 38 comprises a quasi-lumped transmission line.

Figure 10A:
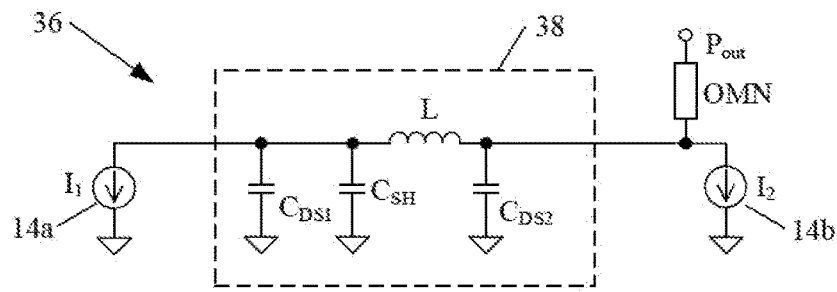
FIG. 10A is a schematic diagram of a Doherty amplifier with a shunt capacitor on the side of the first amplifier, and a lumped inductance impedance inverter.
Figure 10B:
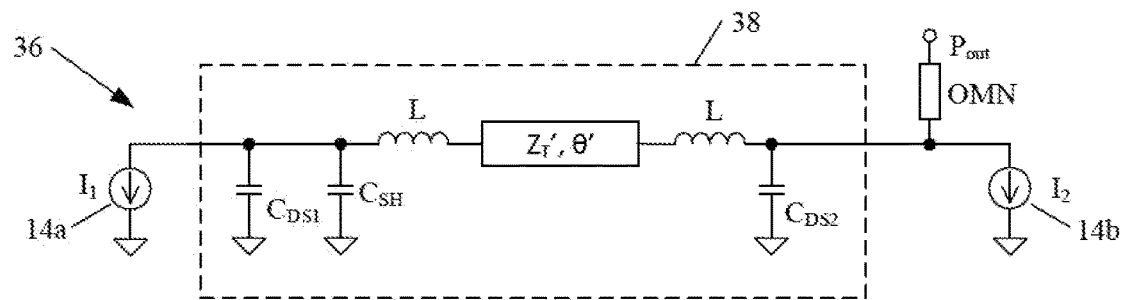
FIG. 10B is a schematic diagram of a Doherty amplifier with a shunt capacitor on the side of the first amplifier, and a quasi-lumped transmission line impedance inverter.

FIGS. 10A and 10B depict another approach to equalizing the parasitic capacitances $C_{DS1}$, $C_{DS2}$ on either side of a Doherty amplifier circuit 36—adding capacitance to the smaller amplifier 14a side. A shunt reactive component comprising a shunt capacitor $C_{SH}$ is connected between one side of the compact impedance inverter 38 and RF signal ground, on the side of the Doherty amplifier 36 having the smaller parasitic capacitance $C_{DS1}$. In one embodiment, $C_{SH} = C_{DS2} - C_{DS1}$. The total capacitance on the first amplifier 14a side is thus $C_{DS1} + C_{SH} = C_{DS2}$, and hence the transmission line formed by these capacitances and, in FIG. 10A the lumped inductance L, is a quarter-wave, with a 90-degree phase shift. FIG. 10B depicts the case where the compact impedance inverter 38 comprises a quasi-lumped transmission line.

Figure 11A:
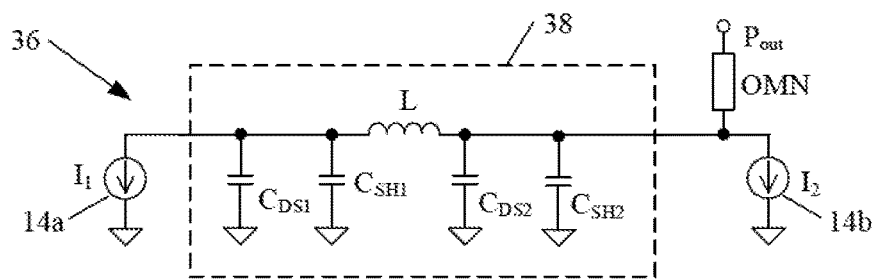
FIG. 11A is a schematic diagram of a Doherty amplifier with shunt capacitors on both sides of a lumped inductance impedance inverter.

FIG. 11A depicts an embodiment of an asymmetric Doherty amplifier 36 having two shunt reactive components—in this case, both shunt capacitances $C_{SH1}$ and $C_{SH2}$—connected between opposite sides of the compact impedance inverter circuit 38 and RF signal ground, on each side of the Doherty amplifier 36. That is, FIG. 11A depicts the circuit of FIG. 10A, with an additional shunt capacitor $C_{SH2}$ added on the second amplifier 14b side of the Doherty amplifier 36. Each of the two shunt capacitors $C_{SH1}$ and $C_{SH2}$ may be sized as desired, to accurately control the characteristic impedance of the compact impedance inverter 38, for example to match it to the seen inductance of a load.

Figure 11B:
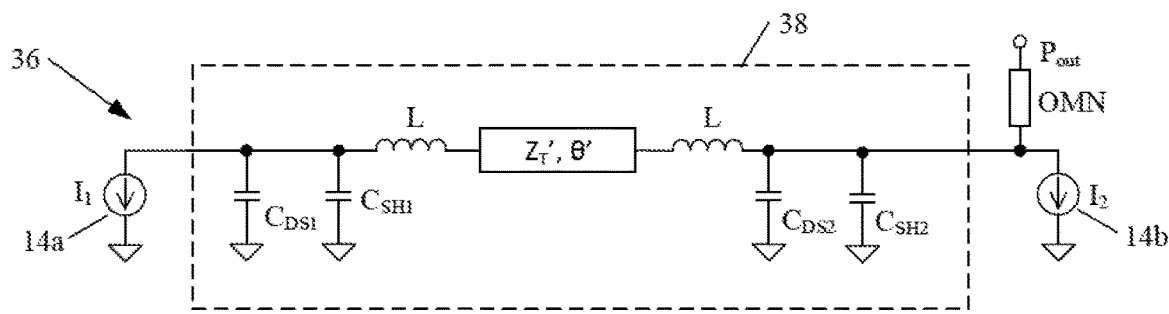
FIG. 11B is a schematic diagram of a Doherty amplifier with shunt capacitors on both sides of a quasi-lumped transmission line impedance inverter.

In the circuit of FIG. 11A, the compact impedance inverter 38 is formed by a lumped impedance L and the capacitances $(C_{DS1} + C_{SH1})$ on one side and $(C_{DS2} + C_{SH2})$ on the other. FIG. 11B depicts a Doherty amplifier circuit 36 with two shunt capacitors $C_{SH1}$ and $C_{SH2}$, using a compact impedance inverter 38 comprising a quasi-lumped transmission line.

Figure 12:
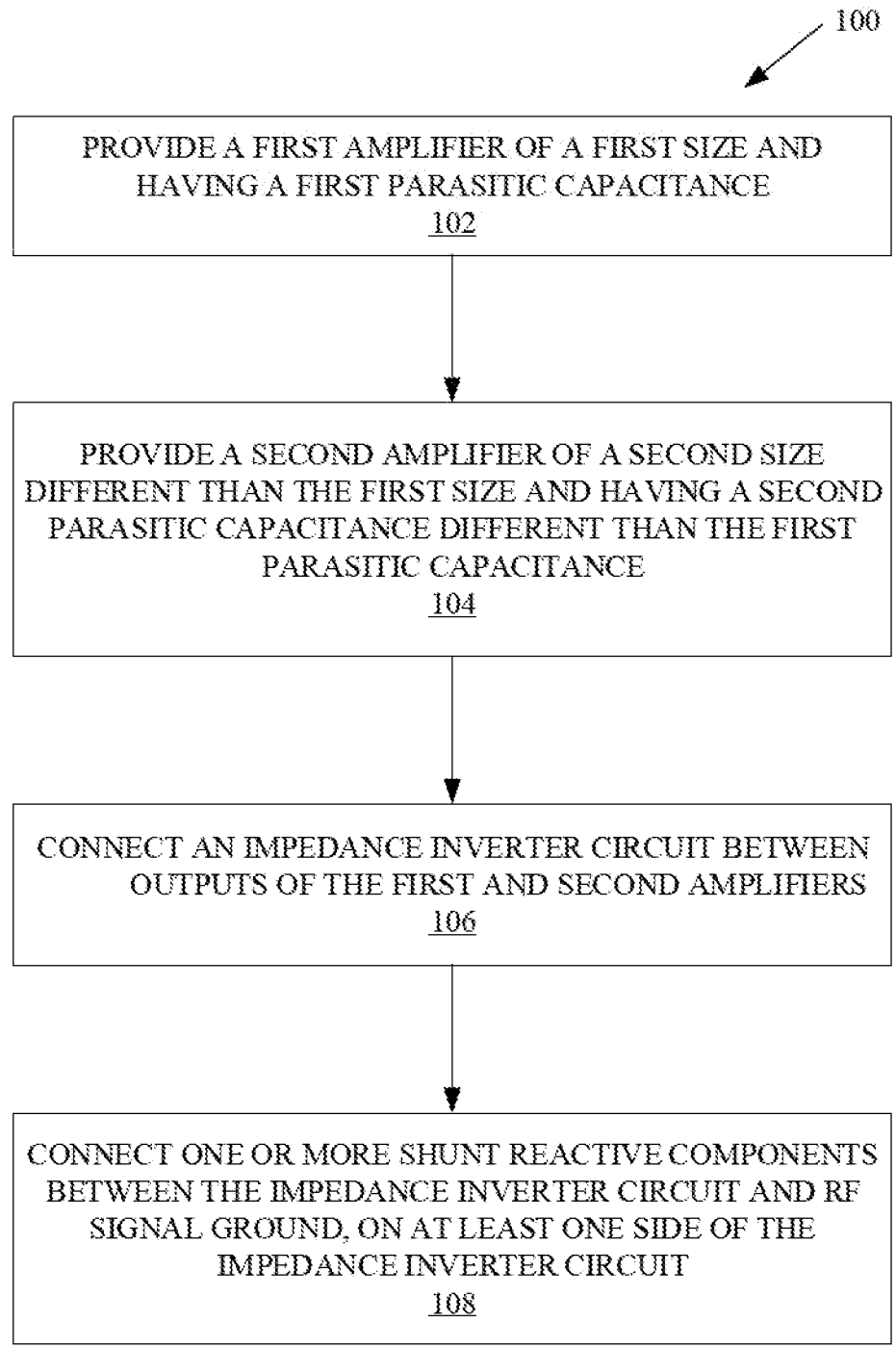
FIG. 12 is a flow diagram of a method of manufacturing an amplifier on an integrated circuit.

FIG. 12 depicts a method 100 of manufacturing an amplifier 36 on an integrated circuit. A first amplifier 14a, of a first size and having a first parasitic capacitance 16a, is provided (block 102). A second amplifier 14b, of a second size different than the first size and having a second parasitic capacitance 16b different than the first parasitic capacitance 16a, is provided (block 104). An impedance inverter circuit 38 is connected between the first 14a and second 14b amplifiers (block 106). The impedance inverter circuit 38 may comprise a lumped inductance and the parasitic capacitances 16a, 16b of the first 14a and second 14b amplifiers, or may comprise a quasi-lumped transmission line using the parasitic capacitances 16a, 16b. One or more shunt reactive components are connected between the impedance inverter circuit 38 and RF signal ground, on at least one side of the impedance inverter circuit 38 (block 108). The shunt reactive components may be added to only one amplifier side, or if necessary to both sides, to substantially equalize the total capacitances of the first 14a and second 14b amplifiers, allowing for their incorporation into a compact impedance inverter 38. Shunt reactive components may also be added to one or both sides, to control the characteristic impedance of the compact impedance inverter 38.

Embodiments of the present invention present numerous advantages over Doherty amplifiers of the prior art. Although asymmetric Doherty amplifiers are preferred for high power and efficiency when amplifying high-PAPR signals, the difference in parasitic capacitances 16a, 16b of the different device sizes prevents their incorporation to form a compact quarter-wavelength impedance inverter 38.

By adding one or more shunt reactive components on at least one side of the impedance inverter circuit 38, the difference in capacitance between the two amplifiers 14*a*, 14*b* may be substantially reduced, allowing for a 90-degree phase shift in the compact impedance inverter 38. By adding additional shunt reactive components, such as on both sides of the compact impedance inverter circuit 38, the characteristic impedance of the compact impedance inverter circuit 38 can be tailored to a desired value (such as to match the seen impedance of the load, for broadband operation).

Figure 1:
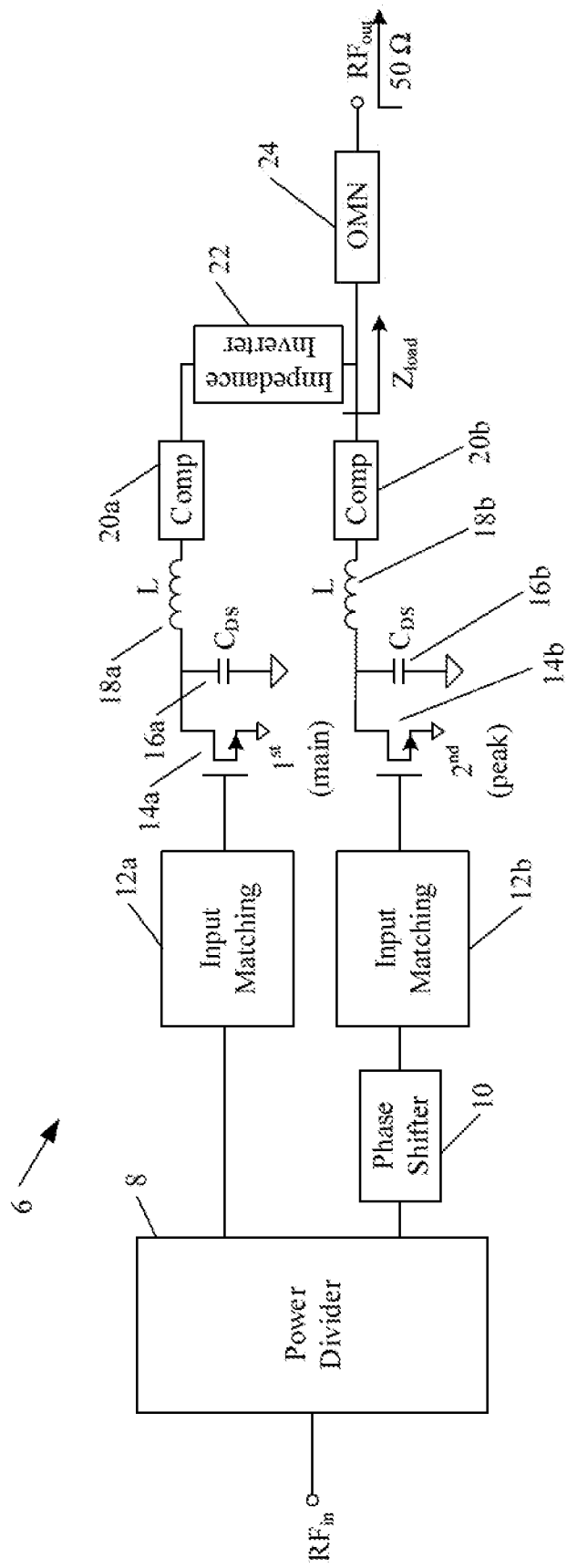
FIG. 1 is a block diagram of a prior art Doherty amplifier.
Figure 2:
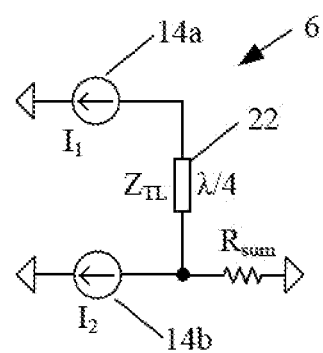
FIG. 2 is a circuit model of a prior art Doherty amplifier.
Figure 3A:
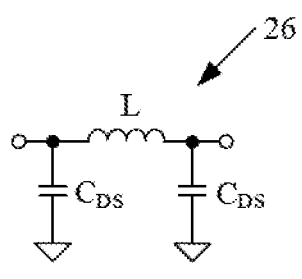
FIG. 3A is a schematic diagram of a prior art impedance inverter implemented as a lumped inductance and parasitic capacitances.
Figure 3B:
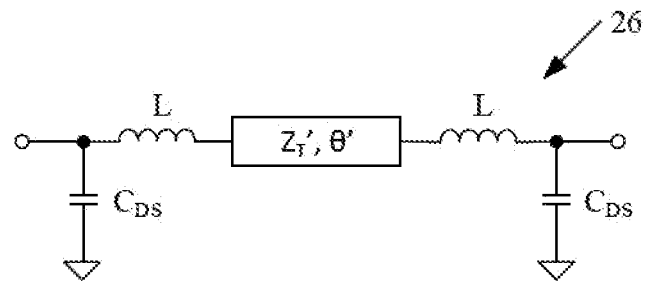
FIG. 3B is a schematic diagram of a prior art impedance inverter implemented as quasi-lumped transmission line comprising a transmission line, lumped inductances, and parasitic capacitances.

The advantages of a compact impedance inverter 38 are numerous. For example, it allows the impedance inverter 38 to be implemented in the same integrated circuit package as the other Doherty amplifier components. Completely "in-package" Doherty amplifier implementation will be critical as the number of MIMO antennas (and hence RF power amplifiers) per device increases in 5G communication networks and beyond. Additionally, because the compact impedance inverter 38 can be tightly integrated with the Doherty amplifiers 14*a*, 14*b*, in the configurations depicted in the drawings, the electrical length from the first, or main amplifier 14*a* to the summing node is 90 degrees, and the electrical length from the second, or peak amplifier 14*b* is zero degrees. The Doherty amplifier 36 according to embodiments of the present invention can thus achieve a physically compact design—such as at least 50% smaller (measured in footprint area or volume) than prior art Doherty configurations 6 (FIG. 1), where one amplifier has an electrical length of 90 degrees and the other has an electrical length of 180 degrees at the outputs. In some embodiments, the Doherty amplifier 36 can be at least 20% smaller, and in other embodiments, the Doherty amplifier 36 can be 33% smaller.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A Doherty amplifier, comprising:
   a main amplifier of a first size and having a first parasitic capacitance;
   a peak amplifier of a second size larger than the first size and having a second parasitic capacitance larger than the first parasitic capacitance;
   an impedance inverter circuit connecting outputs of the main and peak amplifiers; and
   one or more shunt reactive components connected between an end of the impedance inverter circuit and RF signal ground, on the peak amplifier side of the impedance inverter circuit, the one or more shunt reactive components configured to compensate for the difference in parasitic capacitances between the main and peak amplifiers.

2. The Doherty amplifier of claim 1, wherein the impedance inverter circuit comprises a lumped impedance and at least part of the first and second parasitic capacitances.

3. The Doherty amplifier of claim 1, wherein the impedance inverter circuit comprises a quasi-lumped quarter-wave transmission line and at least part of the first and second parasitic capacitances.

4. The Doherty amplifier of claim 1, wherein the one or more shunt reactive components comprises a first shunt inductance connected between the impedance inverter circuit and RF signal ground on the side of the peak amplifier.

5. The Doherty amplifier of claim 4, wherein the first shunt inductance is connected between the impedance inverter circuit and a DC blocking capacitor, which is connected to ground and presents a short circuit path to ground at the RF signal frequencies.

6. The Doherty amplifier of claim 5, wherein the first shunt inductance comprises one or more wire bonds between the impedance inverter circuit and the DC blocking capacitor.

7. The Doherty amplifier of claim 6, wherein the first shunt inductance is operative to reduce the difference between the first and second parasitic capacitances.

8. The Doherty amplifier of claim 7, wherein the first shunt inductance $L_{SH}$ is given by:

$$L_{SH} = \frac{1}{\omega^2(C_{DS2} - C_{DS1})}$$

where
   $\omega$ is the angular frequency of the RF signals;
   $C_{DS1}$ is the parasitic capacitance associated with the main amplifier; and
   $C_{DS2}$ is the larger parasitic capacitance associated with the peak amplifier.

9. The Doherty amplifier of claim 4, further comprising a first shunt capacitor connected between the impedance inverter circuit and RF signal ground on the side of the main amplifier, wherein the values of the first shunt inductance and the first shunt capacitor are selected to reduce a difference between the total capacitances of the main and peak amplifiers.

10. The Doherty amplifier of claim 4, further comprising a second shunt inductance connected between the impedance inverter circuit and RF signal ground on the side of the main amplifier, and wherein the values of the main and peak shunt inductances are selected, at least in part, to control a characteristic impedance of the impedance inverter circuit.

11. The Doherty amplifier of claim 1, further comprising a first shunt capacitor connected between the impedance inverter circuit and RF signal ground on the side of the main amplifier.

12. The Doherty amplifier of claim 11, wherein the value of the first shunt capacitor is selected to achieve substantially equal capacitances on the main and peak amplifier sides of the impedance inverter circuit.

13. The Doherty amplifier of claim 11, wherein the one or more shunt reactive components connected between the impedance inverter circuit and RF signal ground, on the peak amplifier side of the impedance inverter circuit, comprises a second shunt capacitor connected between the impedance inverter circuit and RF signal ground, and wherein the values of the first and second shunt capacitors are selected, at least in part, to control a characteristic impedance of the impedance inverter circuit.

14. The Doherty amplifier of claim 1, wherein the Doherty amplifier achieves at least a 50% reduction in area compared to a Doherty amplifier where one amplifier has an electrical length of 90 degrees and the other has an electrical length of 180 degrees at the outputs.

15. A method of manufacturing a Doherty amplifier on an integrated circuit, comprising:
   providing a main amplifier of a first size and having a first parasitic capacitance;

providing a peak amplifier of a second size larger than the first size and having a second parasitic capacitance larger than the first parasitic capacitance;

connecting an impedance inverter circuit between outputs of the main and peak amplifiers; and connecting one or more shunt reactive components between an end of the impedance inverter circuit and RF signal ground, on the peak amplifier side of the impedance inverter circuit, wherein the one or more shunt reactive components are configured to compensate for the difference in parasitic capacitances between the main and peak amplifiers.

16. The method of claim 15, wherein the impedance inverter circuit comprises a lumped impedance and at least part of the first and second parasitic capacitances.

17. The method of claim 15, wherein the impedance inverter circuit comprises a quasi-lumped quarter-wave transmission line and at least part of the first and second parasitic capacitances.

18. The method of claim 15, wherein connecting one or more shunt reactive components comprises connecting a first shunt inductance between the impedance inverter circuit and RF signal ground on the side of the peak amplifier.

19. The method of claim 18, wherein the first shunt inductance is connected between the impedance inverter circuit and a DC blocking capacitor, which is connected to ground and presents a short circuit path to ground at RF signal frequencies.

20. The method of claim 18, wherein the first shunt inductance comprises one or more wire bonds between the impedance inverter circuit and the DC blocking capacitor.

21. The method of claim 20, wherein the first shunt inductance is operative to reduce the difference between the first and second parasitic capacitances.

22. The method of claim 21, wherein the first shunt inductance $L_{SH}$ is given by:

$$L_{SH} = \frac{1}{\omega^2(C_{DS2} - C_{DS1})}$$

where
ω is the angular frequency of the RF signals;
$C_{DS1}$ is the parasitic capacitance associated with the main amplifier; and
$C_{DS2}$ is the larger parasitic capacitance associated with the peak amplifier.

23. The method of claim 18, wherein connecting one or more shunt reactive components further comprises connecting a first shunt capacitor between the impedance inverter circuit and RF signal ground on the side of the main amplifier, wherein the values of the first shunt inductance and first shunt capacitor are selected to reduce a difference between the total capacitances of the main and peak amplifiers.

24. The method of claim 18, wherein connecting one or more shunt reactive components further comprises connecting a second shunt inductance between the impedance inverter circuit and RF signal ground on the side of the main amplifier, wherein the values of the first and second shunt inductances are selected, at least in part, to control a characteristic impedance of the impedance inverter circuit.

25. The method of claim 15, further comprising connecting a first shunt capacitor between the impedance inverter circuit and RF signal ground on the side of the main amplifier.

26. The method of claim 25, wherein the value of the first shunt capacitor is selected to achieve substantially equal capacitances on the main and peak amplifier sides of the impedance inverter circuit.

27. The method of claim 25, wherein connecting one or more shunt reactive components between the impedance inverter circuit and RF signal ground, on the peak amplifier side of the impedance inverter circuit, comprises connecting a second shunt capacitor between the impedance inverter circuit and RF signal ground, and wherein the values of the first and second shunt capacitors are selected, at least in part, to control a characteristic impedance of the impedance inverter circuit.

28. The method of claim 15, wherein the wherein the Doherty amplifier achieves at least a 50% reduction in area compared to a Doherty amplifier where one amplifier has an electrical length of 90 degrees and the other has an electrical length of 180 degrees at the outputs.

* * * * *